(12) United States Patent
Yu et al.

(10) Patent No.: US 11,749,612 B2
(45) Date of Patent: Sep. 5, 2023

(54) SEMICONDUCTOR PACKAGE DEVICE

(71) Applicant: Phoenix Pioneer Technology Co., Ltd., Hsinchu County (TW)

(72) Inventors: Chun-Hsien Yu, Hsinchu County (TW); Shih-Ping Hsu, Hsinchu County (TW); Hsien-Ming Tsai, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 172 days.

(21) Appl. No.: 17/536,158

(22) Filed: Nov. 29, 2021

(65) Prior Publication Data

US 2022/0173048 A1    Jun. 2, 2022

(30) Foreign Application Priority Data

Dec. 2, 2020   (TW) .................................. 109142356

(51) Int. Cl.
| | |
|---|---|
| *H01L 23/495* | (2006.01) |
| *H01L 23/538* | (2006.01) |
| *H01L 23/31* | (2006.01) |
| *H01L 25/10* | (2006.01) |
| *H01L 23/00* | (2006.01) |

(52) U.S. Cl.
CPC ...... *H01L 23/5387* (2013.01); *H01L 23/3121* (2013.01); *H01L 23/5383* (2013.01); *H01L 25/105* (2013.01); *H01L 24/16* (2013.01); *H01L 24/48* (2013.01); *H01L 2224/16235* (2013.01); *H01L 2224/48235* (2013.01)

(58) Field of Classification Search
CPC ............. H01L 23/5383; H01L 23/5387; H01L 25/115; H01L 25/117
USPC ................................................. 257/668, 688
See application file for complete search history.

(56) References Cited

U.S. PATENT DOCUMENTS

| | | | | |
|---|---|---|---|---|
| 5,448,511 A | * | 9/1995 | Paurus | H01L 25/0657 |
| | | | | 361/749 |
| 5,776,797 A | * | 7/1998 | Nicewarner, Jr. | H01L 25/0657 |
| | | | | 438/109 |
| 6,121,676 A | * | 9/2000 | Solberg | H01L 23/5387 |
| | | | | 257/725 |

(Continued)

*Primary Examiner* — Nitin Parekh
(74) *Attorney, Agent, or Firm* — McClure, Qualey & Rodack, LLP

(57) ABSTRACT

A semiconductor package device includes a flexible carrier, a first chip, a second chip, a first molding layer, a first adhesive layer and a second molding layer. The flexible carrier has a flexible layer and a rigid layer. The flexible layer has a patterned build-up circuit. The rigid layer is connected to a portion surface of the flexible layer. The position that the flexible layer connected to the rigid layer is formed a first carrying part and a second carrying part. The region of the flexible layer between the first carrying part and the second carrying part without the rigid layer is formed as a first flexible part. The first chip is connected to the first carrying part by flip-chip manner and the second chip is connected to the second carrying part by flip-chip manner. The first molding layer covers the first chip and the second molding layer covers the second chip. The first adhesive layer is connected between the first molding layer and the second carrying part.

10 Claims, 17 Drawing Sheets

(56) References Cited

U.S. PATENT DOCUMENTS

| | | | | |
|---|---|---|---|---|
| 6,225,688 B1* | 5/2001 | Kim | ........................ | H05K 1/189 |
| | | | | 257/725 |
| 6,246,114 B1* | 6/2001 | Takahashi | ................ | H01L 23/13 |
| | | | | 257/737 |
| 6,717,275 B2* | 4/2004 | Matsuura | ............... | H05K 1/147 |
| | | | | 257/688 |
| 8,525,322 B1* | 9/2013 | Kim | .................... | H01L 25/0657 |
| | | | | 257/691 |
| 2002/0044423 A1* | 4/2002 | Primavera | ........... | H01L 23/4985 |
| | | | | 257/E23.177 |
| 2002/0164838 A1* | 11/2002 | Moon | ................... | H01L 25/105 |
| | | | | 438/109 |
| 2004/0021211 A1* | 2/2004 | Damberg | ............ | H01L 23/5385 |
| | | | | 257/E25.011 |
| 2004/0150085 A1* | 8/2004 | Takahashi | ............ | H01L 25/105 |
| | | | | 257/688 |
| 2004/0238936 A1* | 12/2004 | Rumer | ................ | H01L 25/0657 |
| | | | | 438/117 |
| 2005/0212112 A1* | 9/2005 | Chao | ................... | H01L 25/0657 |
| | | | | 257/688 |
| 2009/0309197 A1* | 12/2009 | Chow | ................... | H01L 25/105 |
| | | | | 257/659 |
| 2013/0119558 A1* | 5/2013 | Hwang | ............ | H01L 23/49816 |
| | | | | 257/777 |

* cited by examiner

SEMICONDUCTOR PACKAGE DEVICE

CROSS REFERENCE TO RELATED APPLICATIONS

This Non-provisional application claims priority under 35 U.S.C. § 119(a) on Patent Application No. 109142356 filed in Republic of China on Dec. 2, 2020, the entire contents of which are hereby incorporated by reference.

BACKGROUND OF THE INVENTION

Field of the Invention

The invention relates to a package device, and particularly relates to a semiconductor package device of a system in package (SIP).

Descriptions of the Related Art

Science and technology are changing with each passing day, and semiconductor chips (dies) have been widely used in daily life. With the evolution of semiconductor manufacturing process and packaging technology, the size of chips has been gradually reduced, and a system composed of multiple chips or other components can be integrated into a single package, which is called system in package (SIP). In the package device of various systems integration in the prior art, there are different aspects of the package structure, such as 2-dimensional (2D) package structure, 2.5-dimensional (2.5D) package structure, package on package (PoP) stacked package structure, and 3-dimensional (3D) package structure, etc.

FIGS. 1A and 1B are respectively a schematic top view and a schematic cross-sectional view of a package structure of 2D package device 1 in the prior art. As shown in FIG. 1A, in the 2D package device 1, a plurality of the chips 14-1 to 14-5 are arranged in a horizontal direction (the direction along the connecting line AA'). In other words, the chips 14-1 to 14-5 are located on the same plane and disposed on the same carrier 10. The chips 14-1 to 14-5 are disposed on the circuit board 15, for example, a printed circuit board (PCB), together with the carrier 10.

Furthermore, as shown in FIG. 1B, which is a cross-sectional view along the line AA' in FIG. 1A, the chip 14-1 and the chip 14-2 (the chips 14-3 to 14-5 do not appear in the cross-section of the line AA') are disposed on the carrier 10 through a plurality of solder bumps 131, and the carrier 10 is disposed on the circuit board 15. Since the single carrier 10 must carry all the chips 14-1 to 14-5 (FIG. 1B only shows the chips 14-1 and 14-2), the carrier 10 must have a relatively large length w1 in the horizontal direction, resulting in the package device 1 being too large. In addition, in order to transmit the signals of the chips 14-1 to 14-5 across the chip, the length of each part of the conductive layer 11 of the carrier 10 in the horizontal direction (especially the length w2 of a part 111 of the conductive layer 11) must also be increased, resulting in an increase in power consumption. Furthermore, because more than two chips 14-1~14-5 are carried at the same carrier, the carrier 10 is prone to warpage and the yield rate decreases. The mentioned above is the problem of the 2D package device 1 in the prior art.

FIG. 2A and FIG. 2B are respectively a schematic plan view and a schematic cross-sectional view of the package structure of the 2.5D package device 2 in the prior art. As shown in FIG. 2A, the 2.5D package device 2 is further provided with a silicon interposer 16 to increase the overall rigidity, which is arranged between the chips 14-1 to 14-5 and the carrier 10.

Furthermore, as shown in FIG. 2B, which is a cross-sectional view along the line AA' in FIG. 2A, the silicon interposer 16 is disposed between the chips 14-1 and 14-2 (the chips 14-3 to 14-5 do not appear in the cross-section of the line AA') and the carrier 10, and includes a plurality of conductive pillars 17.

The chip 14-1 and the chip 14-2 are disposed on the silicon interposer 16 through solder bumps 132, and are electrically connected to the conductive pillars 17, and then to the carrier 10. Via the silicon interposer 16, the equivalent area of the conductive pad of the chips 14-1 and 14-2 can be enlarged, for example, the width w3 of the conductive pad 142 of the chip 14-2 is equivalently enlarged to width w4. However, the additional silicon interposer 16 will result in additional material costs and packaging processes, which is a problem with the 2.5D package device 2 in the prior art.

FIG. 3A and FIG. 3B are respectively a top view and a cross-sectional view of the package structure of the PoP stacked package device 3 in the prior art. As shown in FIG. 3A, the PoP stacked package device 3 includes two carriers 10 and 18, and a plurality of chips 14-1 to 14-3 are arranged in the vertical direction. Among them, the chips 14-2 and 14-3 are stacked on the carrier 18, and the chip 14-1 is disposed on the carrier 10 and located below the carrier 18.

Furthermore, as shown in FIG. 3B, which is a cross-sectional view along the line AA' in FIG. 3A, both the chips 14-1 and 14-2 are disposed on the carrier 10 and the carrier 18 respectively by flip-chip manner. Among them, the conductive pad 141 of the chip 14-1 is electrically connected to the carrier 10 through a solder bump 133, and the conductive pad 142 of the chip 14-2 is electrically connected to the carrier 18 through a solder bump 134. In addition, the chip 14-3 is disposed on the chip 14-2 through the adhesive layer 19, and the conductive pad 143 of the chip 14-3 is electrically connected to the carrier 18 through a lead 20 by wire bonding manner. Through the above method, the chips 14-1 to 14-3 are stacked in a vertical direction, however, the above stacked configuration will cause the chips 14-1 to 14-3 to heat dissipation difficulties and generate high temperatures.

In addition, due to the chip 14-1 occupies a part of the space under the carrier 18, the carrier 18 must increase the additional width w5 to arrange the solder bumps 135 to fan out the input/output port (I/O port) of the carrier 18 to electrically connect to the carrier 10. However, the size of the solder bump 135 is much larger than the solder bumps 133 and 134, which increases the difficulty of packaging, and may cause the connecting point 136 of the solder bump 135 and the carriers 18 and 10 is broken or separated due to improper warping of the carriers 10 and 18. The mentioned above is the problem of the PoP stacked package device 3 in the prior art.

On the other hand, FIG. 3C is a schematic cross-sectional view of the package structure of the PoP stacked package device 3a, which is another aspect of the prior art. As shown in FIG. 3C, in the PoP stacked package device 3a, the conductive pillar 137 (for example, copper pillar) is used to replace the solder bump 135 as the electrical connection path between the carrier 18 and the carrier 10. However, the conductive pillar 137 inevitably increases the lateral area (i.e., the area in the horizontal direction) of the PoP stacked package device 3a, which is a problem of the stacked package device 3a in the prior art.

FIG. 4A and FIG. 4B are the top view and cross-sectional view of the package structure of the 3D package device 4 in the prior art, respectively. As shown in FIG. 4A, in the 3D package device 4, the chip 14-1 and the chip 14-2 are first arranged on the silicon interposer 16 in a horizontal direction. Then, the chip 14-3 is arranged in a vertical direction relative to the chip 14-1, and the chip 14-4 and the chip 14-5 are arranged in a vertical direction relative to the chip 14-2, respectively.

Furthermore, as shown in FIG. 4B, which is a cross-sectional view along the connecting line AA' in FIG. 4A, the conductive pillars 21 are respectively arranged or formed in the chip 14-1 and the chip 14-2 by through-silicon via (TSV) manner so that the chip 14-3 is directly electrically connected to the chip 14-1 through the conductive pillars 21, and the chips 14-4 and 14-5 are directly electrically connected to the chip 14-2 by the conductive pillars 21.

In view of the above problems of the various types of the package device in the prior art, it is necessary to propose an improved package structure, which can have the space utilization of the three-dimensional stacking arrangement and can also consider the overall rigidity of the package device and the simplicity of the packaging process is the purpose of the invention.

SUMMARY OF THE INVENTION

In view of the foregoing, the object of the invention is to provide a package device with an improved stacked package structure, which can combine space utilization, overall structural rigidity, and simplicity of packaging process.

To achieve the above objective, the present invention provides a semiconductor package device, including a flexible carrier, a first chip, a second chip, a first molding layer, a first adhesive layer, a second chip, and a second molding layer. The flexible carrier includes a flexible layer that has a patterned build-up circuit and is flexible, and a rigid layer combined with a part of the surface of the flexible layer. The part where the flexible layer is combined with the rigid layer is formed as a first carrying part and a second carrying part, and the flexible layer without the rigid layer between the first carrying part and the second carrying part is formed as a first flexible part. The first chip has an active surface and a non-active surface opposite to each other, and is combined to the first carrying part by flip-chip manner with the side of active surface. The first molding layer is disposed on the first carrying part, and covers the first carrying part and the first chip. The first adhesive layer is disposed on the first molding layer for the second carrying part to be combined with the first molding layer, and the first flexible part connecting the second carrying part and the first carrying part is bent at least 180-degree. The second chip has an active surface and a non-active surface opposite to each other, and is combined to the second carrying part by flip-chip manner with the side of active surface. The second molding layer is disposed on the second carrying part and covers the second carrying part and the second chip.

In one embodiment, the first carrying part and the second carrying part are electrically connected by the patterned build-up circuit in the carrier.

In one embodiment, a bottom of the first carrying part is electrically connected to a circuit board.

In one embodiment, the semiconductor package device further includes a sixth chip. The sixth chip is embedded in the first molding layer and has an active surface and a non-active surface opposite to each other. The sixth chip is combined to the non-active surface of the first chip by the side of non-active surface through a fourth adhesive layer. Among them, the active surface of the sixth chip is electrically connected to the first carrying part by a first lead.

In one embodiment, the semiconductor package device further includes a third chip. The third chip is embedded in the second molding layer and has an active surface and a non-active surface opposite to each other. The third chip is combined to the non-active surface of the second chip by the side of non-active surface through a second adhesive layer. Among them, the active surface of the third chip is electrically connected to the second carrying part by a second lead.

In one embodiment, the flexible carrier of the semiconductor package device further includes a second flexible part and a third carrying part. The second flexible part only has the flexible layer, the third carrying part has the flexible layer and the rigid layer. The third carrying part is connected to the second carrying part through the second flexible part, and the third carrying part and the first carrying part are arranged on the same plane. In addition, the semiconductor package device further includes a fourth chip and a third molding layer. The fourth chip has an active surface and a non-active surface opposite to each other, and is connected to the third carrying part with the side of active surface by flip-chip manner. The third molding layer is disposed on the third carrying part and covers the third carrying part and the fourth chip.

In one embodiment, the first carrying part, the second carrying part, and the third carrying part are electrically connected by the patterned build-up circuit in the flexible carrier.

In one embodiment, a bottom of the third carrying part is electrically connected to the circuit board.

In one embodiment, the semiconductor package device further includes a fifth chip. The fifth chip is embedded in the third molding layer and has an active surface and a non-active surface opposite to each other. The fifth chip is combined to the non-active surface of the fourth chip through a third adhesive layer with the side of non-active surface, where the active surface of the fifth chip is electrically connected to the third carrying part by a third lead.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DESCRIPTION OF THE PREFERRED EMBODIMENT

In the following description, this invention will be explained with reference to embodiments thereof. However, the description of these embodiments is only for purposes of illustration rather than limitation. Hereinafter, the semiconductor package structure and the method for manufacturing the semiconductor package structure of the preferred embodiment of the present invention will be described with reference to related drawings.

Figure 1A:
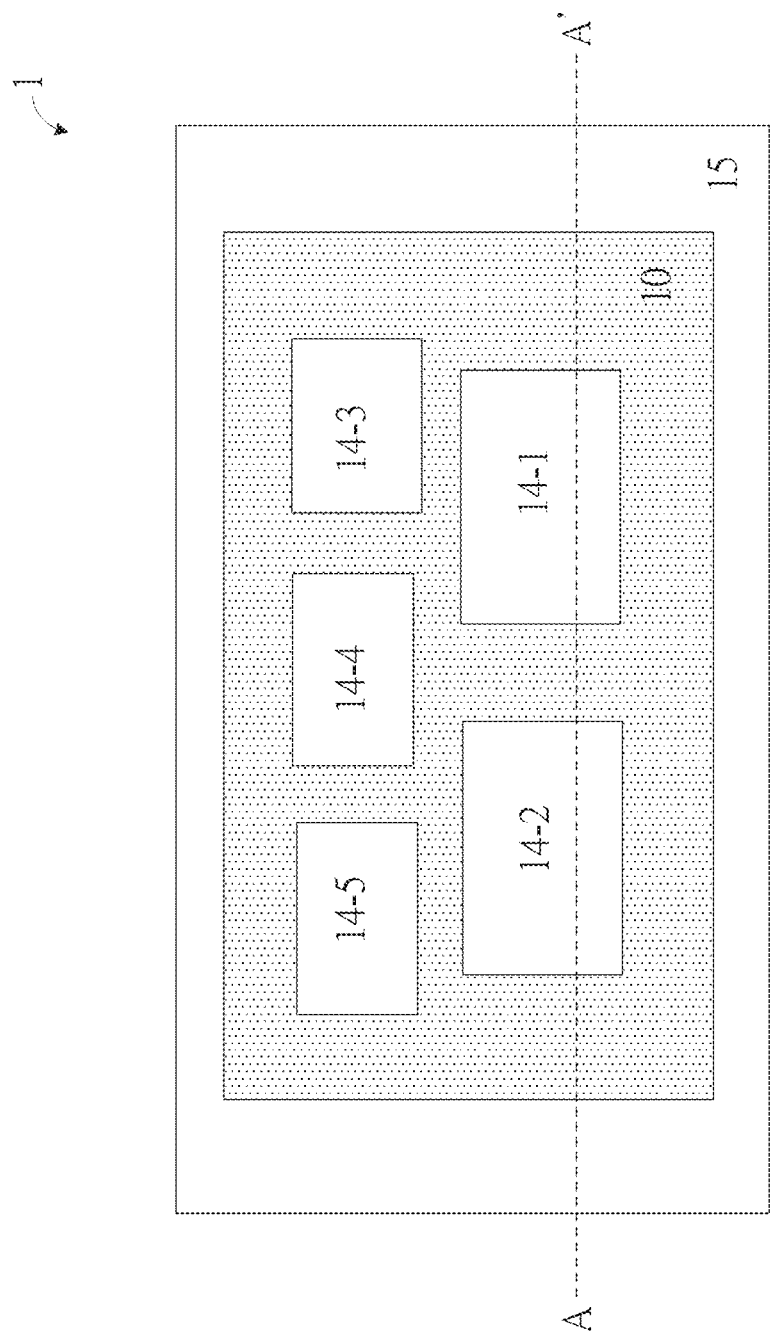
FIGS. 1A and 1B are respectively a schematic plan view and a schematic cross-sectional view of a package structure of a 2D package device of the prior art.
Figure 1B:
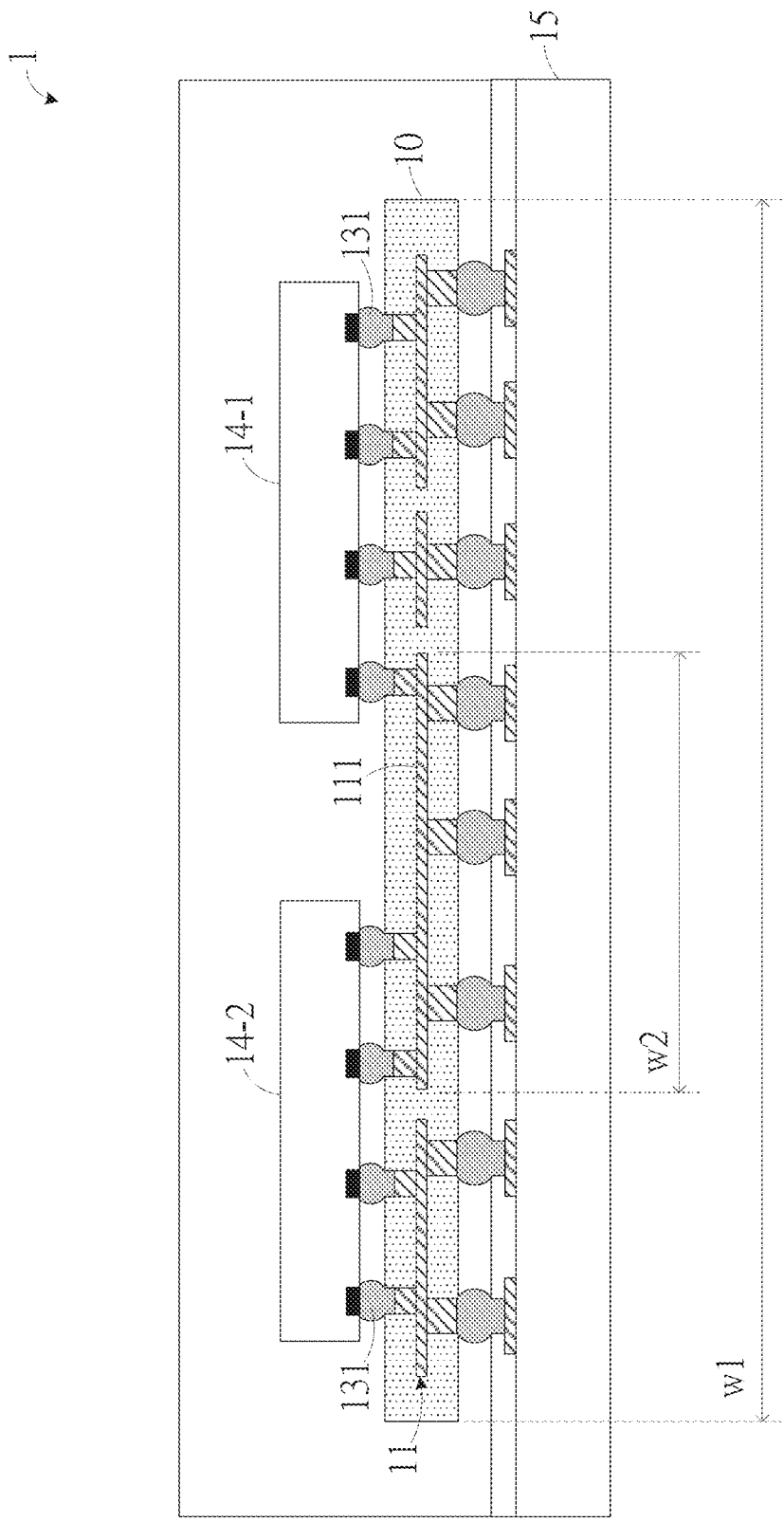
Figure 2A:
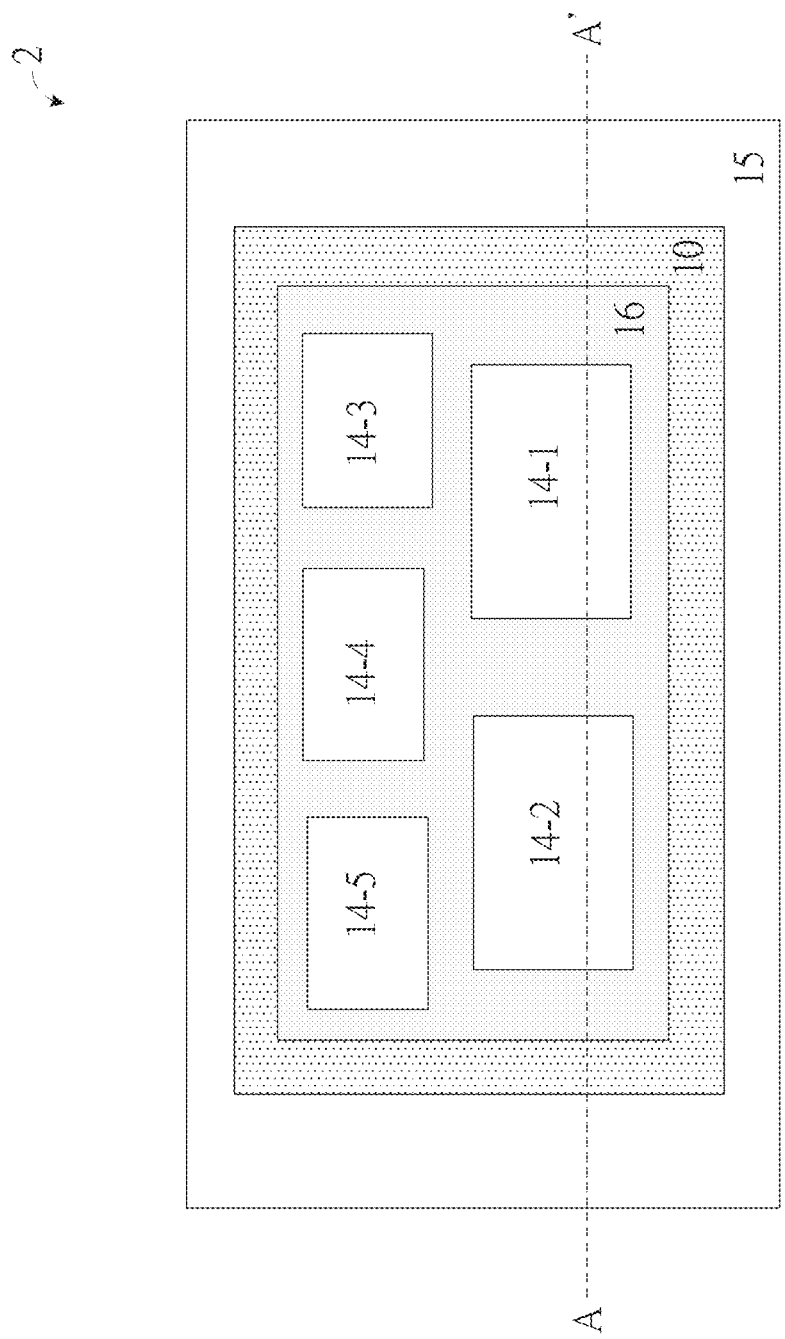
FIGS. 2A and 2B are respectively a schematic plan view and a schematic cross-sectional view of a package structure of a 2.5D package device of the prior art.
Figure 2B:
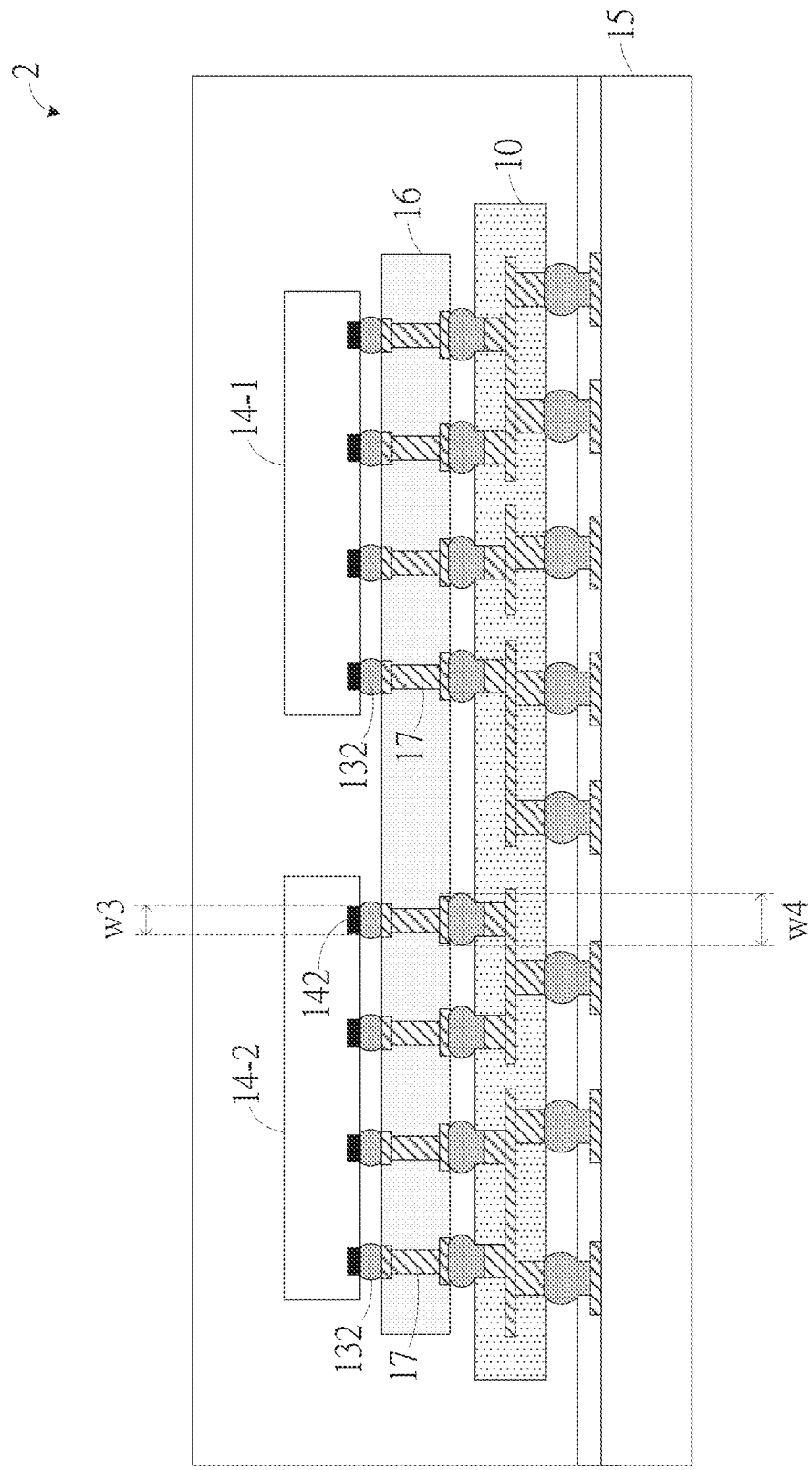
Figure 3A:
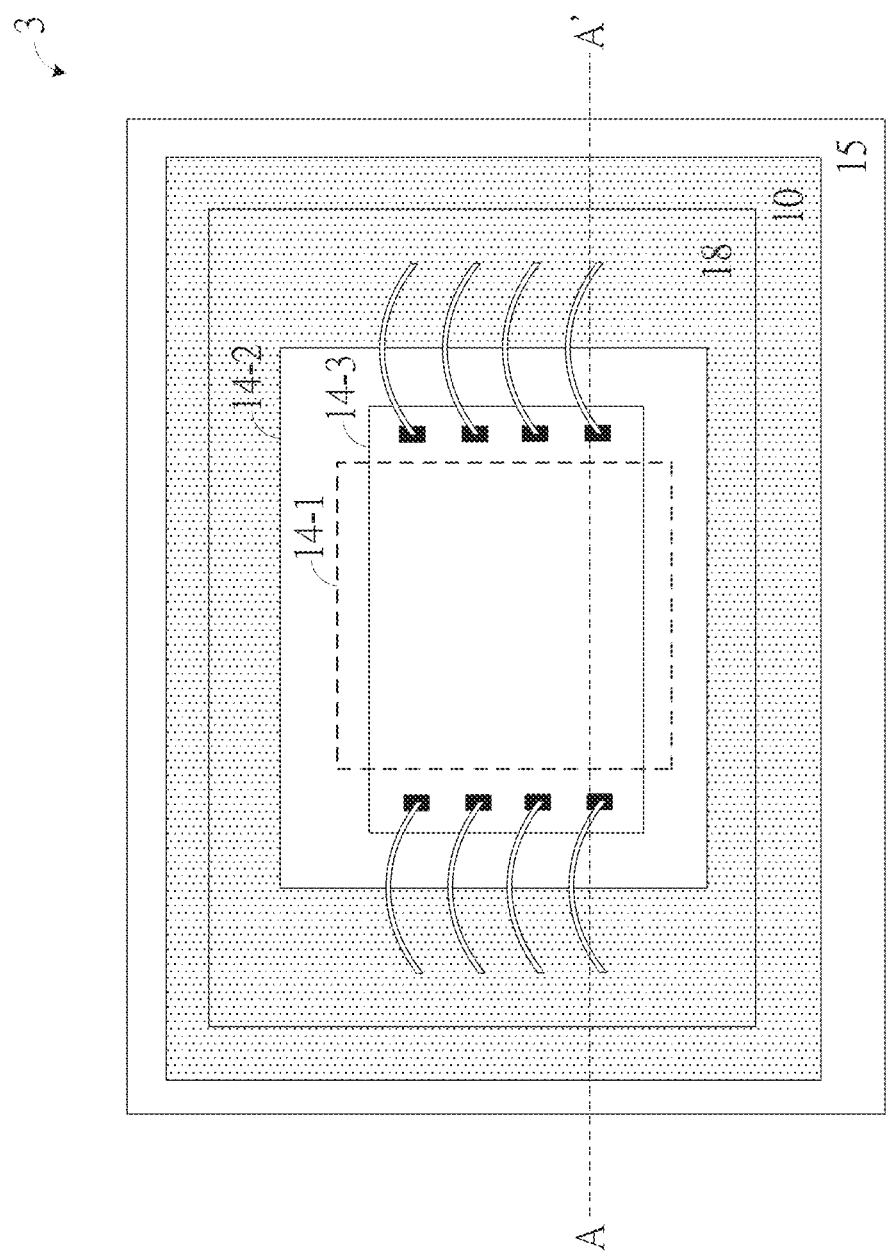
FIGS. 3A and 3B are respectively a schematic plan view and a schematic cross-sectional view of a package structure of a PoP stacked package device of the prior art.
Figure 5A:
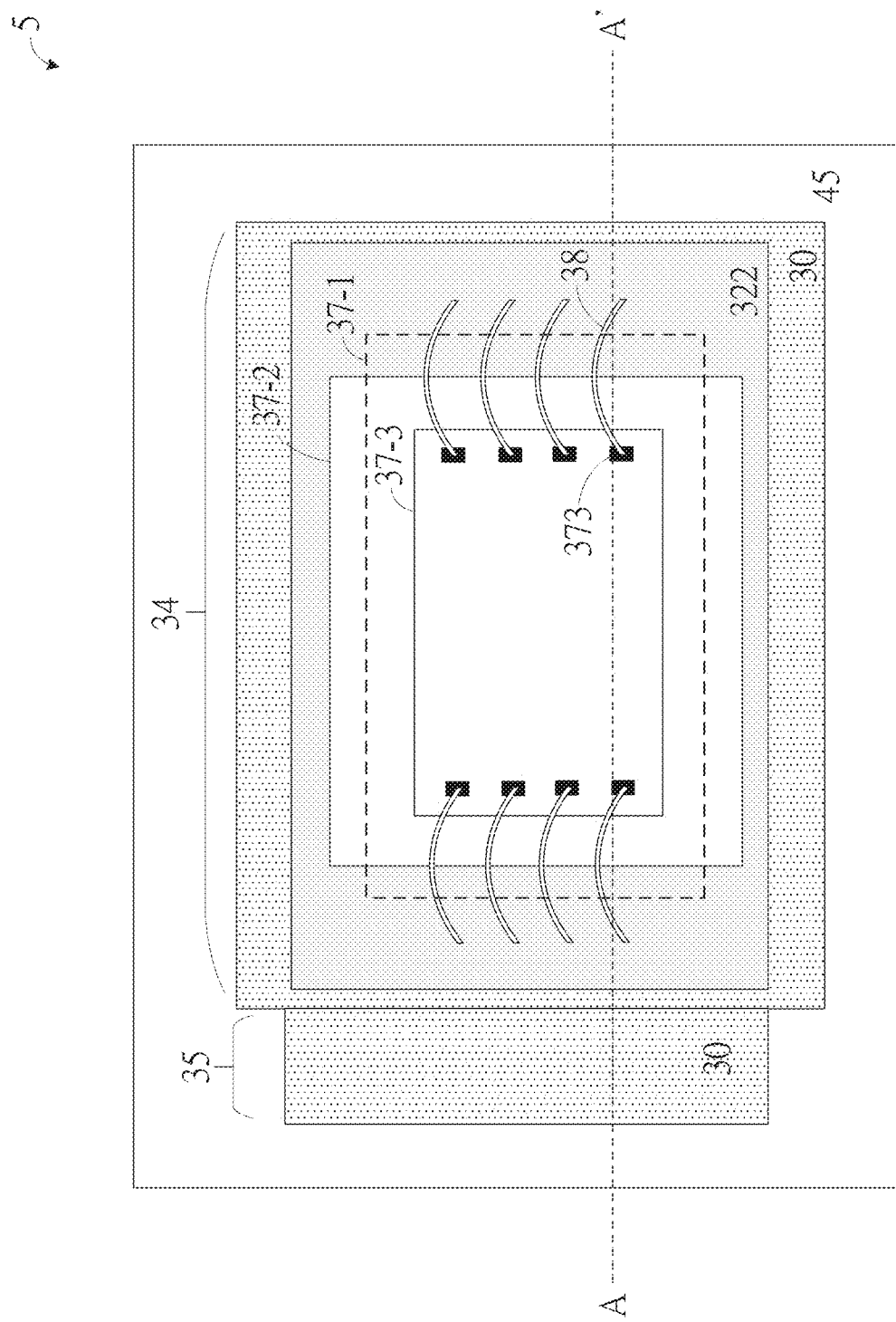
FIG. 5A is a schematic top view of a semiconductor package device according to the first embodiment of the invention.
Figure 5B:
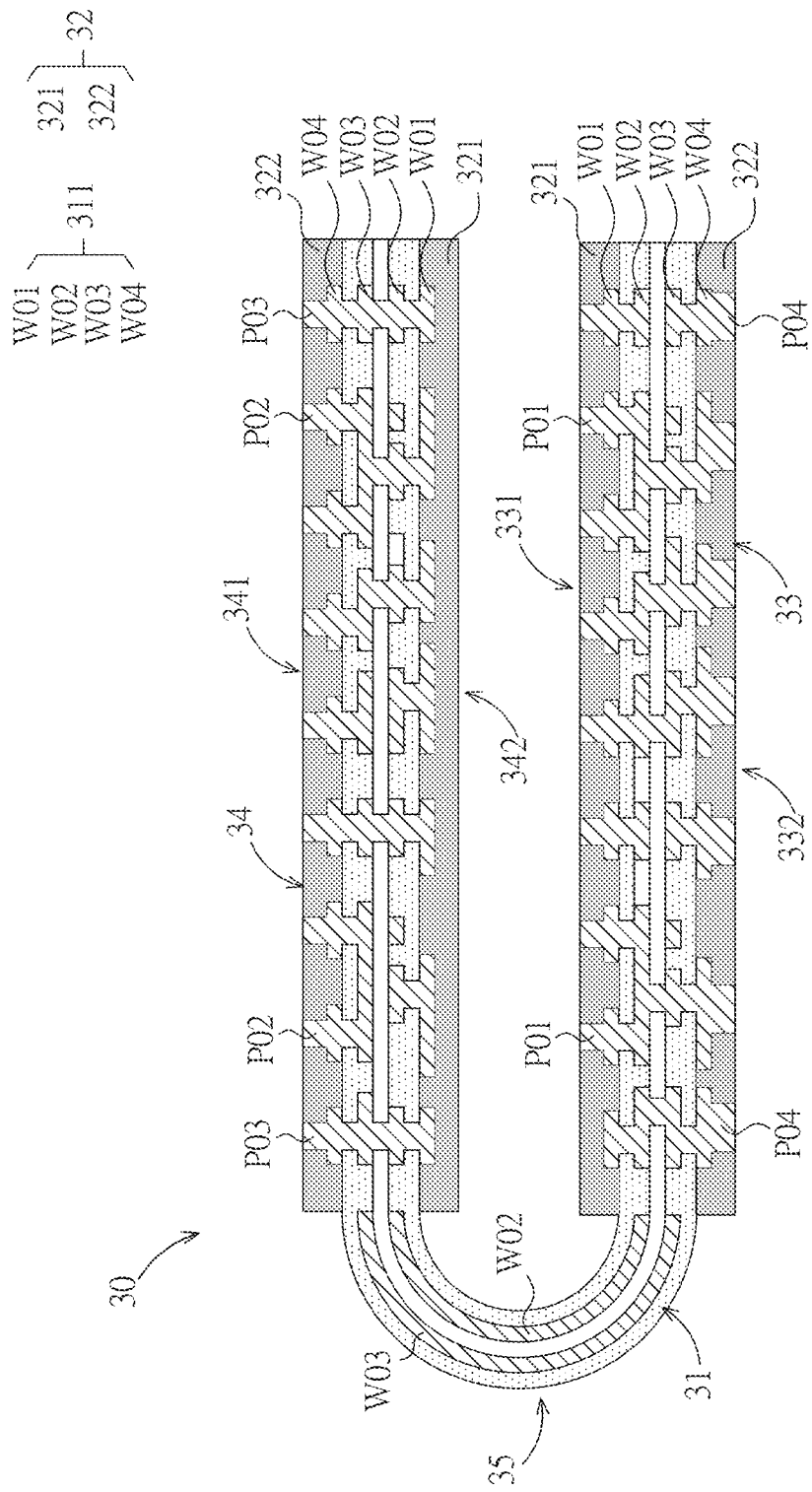
FIG. 5B is a schematic cross-sectional view of a flexible carrier of the semiconductor package device according to the first embodiment of the invention.
Figure 5C:
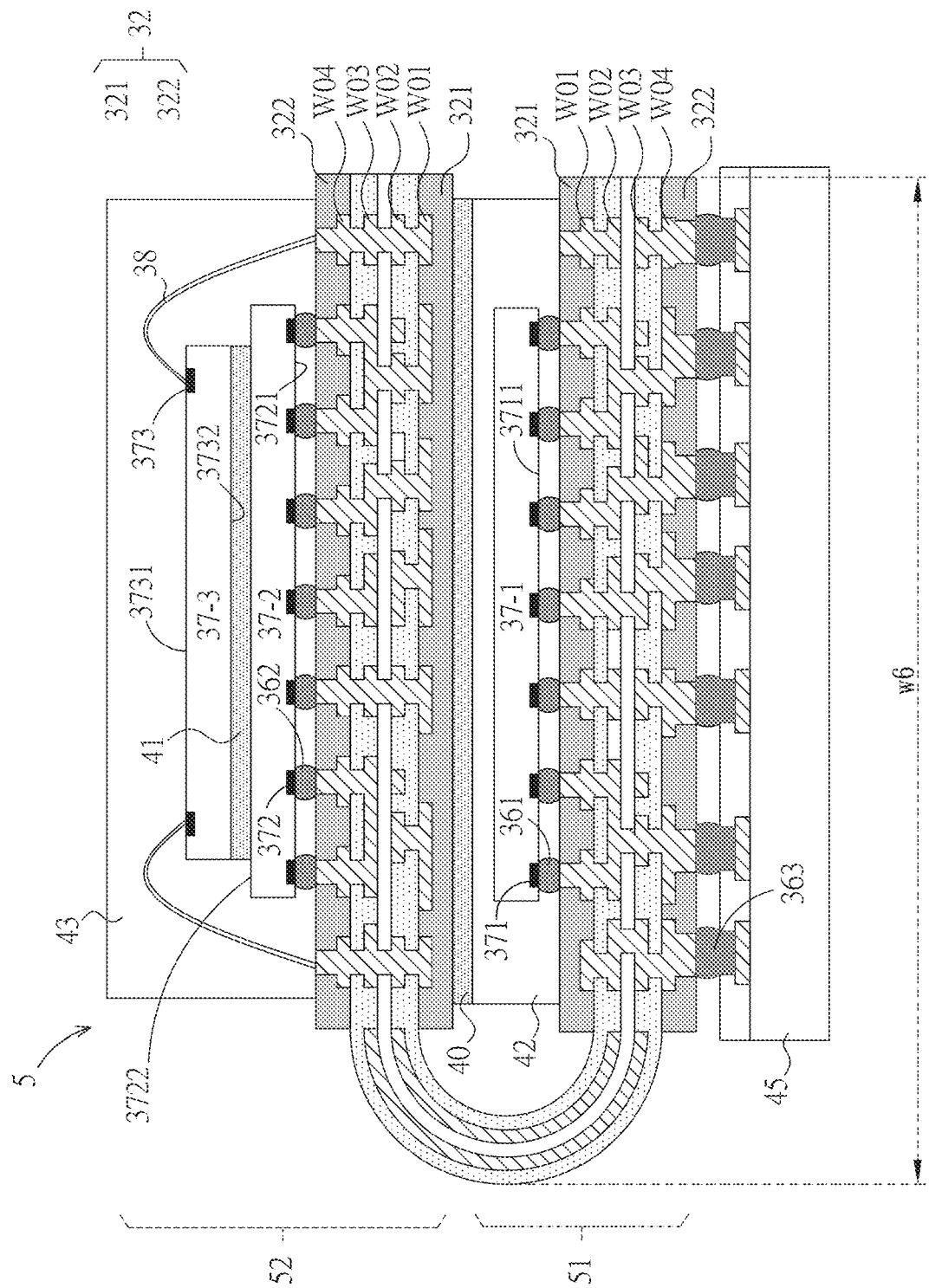
FIG. 5C is a schematic cross-sectional view of the semiconductor package device according to the first embodiment of the invention.

FIG. 5A to FIG. 5C are respectively a schematic top view and a schematic cross-sectional view of the package structure of a semiconductor package device 5 of the first embodiment of the invention. As shown in FIG. 5A, the semiconductor package device 5 is disposed on a circuit board 45, and a flexible carrier 30, which is flexible or bendable, is to replace the rigid carrier of the prior art (for example, instead of the rigid carriers 10 and 18 shown in FIG. 3A).

As shown in FIG. 5B, the flexible carrier 30 includes a flexible layer 31 and a rigid layer 32. The flexible layer 31 has a patterned build-up circuit 311 and is flexible. The rigid layer 32 is bonded to a part of the surface of the flexible layer 31. The part where the flexible layer 31 is combined with the rigid layer 32 can be formed into a first carrying part 33 and a second carrying part 34. The flexible layer 31 without the rigid layer 32 between the first carrying part 33 and the second carrying part 34 is formed as a first flexible part 35. To further illustrate, the rigid layer 32 further includes a first rigid layer 321 and a second rigid layer 322, which are respectively disposed on the opposite surfaces of the flexible layer 31.

In the embodiment, the first carrying part 33 and the second carrying part 34 are rigid and inflexible, so they are flat in the horizontal direction to facilitate the flip-chip bonding of the chip. The first flexible part 35 is bent at 180 degrees, so that the second carrying part 34 can be turned over and positioned above the first carrying part 33, and the second carrying part 34 is parallel to the first carrying part 33. As shown in FIG. 5A, the second carrying part 34 is connected to the first carrying part 33 through the first flexible part 35, and the second carrying part 34 is positioned above the first carrying part 33.

The first carrying part 33 has a first side 331 and a second side 332 oppositely arranged. In addition, the second carrying part 34 also has a first side 341 and a second side 342 oppositely arranged. The second side 342 of the second carrying part 34 faces the first side 331 of the first carrying part 33 through the reverse bending of the first flexible part 35.

The patterned build-up circuit 311 includes a plurality of conductive layers W01-W04 and a plurality of conductive pillars P01-P04. The conductive layers W01-W04 are patterned conductive layers with predetermined circuit patterns, which are used as electrical connection paths and signal transmission paths in the horizontal direction. The conductive pillars P01-P04 are used as electrical connection paths and signal transmission paths in the vertical direction.

The material of the first rigid layer 321 and the second rigid layer 322 is, for example, FR4 glass fiber dielectric material, which can function as a substrate of a traditional rigid circuit board to provide sufficient support to carry active components and passive components including chips.

FIG. 5C is a cross-sectional view along the line AA' in FIG. 5A. Refer to FIG. 5C, the semiconductor package device 5 also includes a first chip 37-1, a second chip 37-2, and a third chip 37-3, a plurality of molding layers 42-43, and a plurality of adhesive layers 40-41.

The first chip 37-1, the second chip 37-2, and the third chip 37-3 are respectively arranged at different positions or different relative positions of the flexible carrier 30. With the flexible carrier 30 of the embodiment, the first chip 37-1, the second chip 37-2, and the third chip 37-3 can be arranged in 3D stacking manner, and space can be effectively used. In the embodiment, the first chip 37-1 is disposed between the first carrying part 33 and the second carrying part 34 of the flexible carrier 30. In detail, the active surface 3711 of the first chip 37-1 faces downward to combine to the first side 331 of the first carrying part 33 by flip-chip manner. Among them, the conductive pad 371 (or called metal pad or metal electrode pad) disposed on the active surface 3711 is fixedly disposed on the first rigid layer 321 via the solder bump 361 (or called tin-lead bump). The conductive pad 371 is further electrically connected to the conductive pillar P01 inside the first carrying part 33, and then electrically connected to the conductive layers W01-W04 inside the first carrying part 33.

The molding layer 42 is formed on the first rigid layer 321 of the first side 331 of the first carrying part 33, and completely covers the first chip 37-1 and the solder bump 361. The molding layer 42 can be formed by a molding process, and its material is a molding compound, such as novolac-based resin, epoxy-based resin, or silicon-based resin. In addition, the adhesive layer 40 is disposed or formed on the molding layer 42 so that the second carrying part 34 can be combined on the molding layer 42 with the second side 342 thereof.

Continuing, the first carrying part 33, the first chip 37-1, and the molding layer 42 of the flexible carrier 30 constitute a bottom package part 51 of the semiconductor package device 5. The bottom package part 51 is disposed on the circuit board 45 through the solder bump 363. That is, the bottom package part 51 is connected to the circuit board 45 by the second side 332 of the first carrying part 33 via the solder bump 363.

On the other hand, the second chip 37-2 and the third chip 37-3 are stacked on the second carrying part 34 in a vertical direction. Among them, the active surface 3721 of the second chip 37-2 faces downwards and is connected to the first side 341 of the second carrying part 34 by flip-chip manner. The conductive pad 372 disposed on the active surface 3721 is electrically connected to the conductive pillar P02 inside the second carrying part 34 through the solder bump 362, and then electrically connected to the conductive layers W01-W04 inside the second carrying part 34. In other words, the active surface 3721 of the second chip 37-2 is electrically connected to the first side 341 of the second carrying part 34 by flip-chip manner.

In addition, the active surface 3731 of the third chip 37-3 faces upward, and the non-active surface 3732 is bonded to the non-active surface 3722 of the second chip 37-2 via the adhesive layer 41. In other words, the second chip 37-2 and the third chip 37-3 are stacked in a vertical direction in back-to-back manner. The conductive pad 373 disposed on the active surface 3731 of the third chip 37-3 is electrically connected to the conductive pillar P03 inside the second carrying part 34 through the lead 38 by wire bonding manner, and then is electrically connected to the conductive layers W01-W04 inside the second carrying part 34. In other words, the active surface 3731 of the third chip 37-3 is electrically connected to the first side 341 of the second carrying part 34 by wire bonding manner.

The molding layer 43 is formed by a molding process, and its material is also a molding compound. The molding layer 43 is formed on the second rigid layer 322 of the first side 341 of the second carrying part 34, and completely covers the second chip 37-2, the third chip 37-3, the lead 38 and the solder bump 362.

Figure 3B:
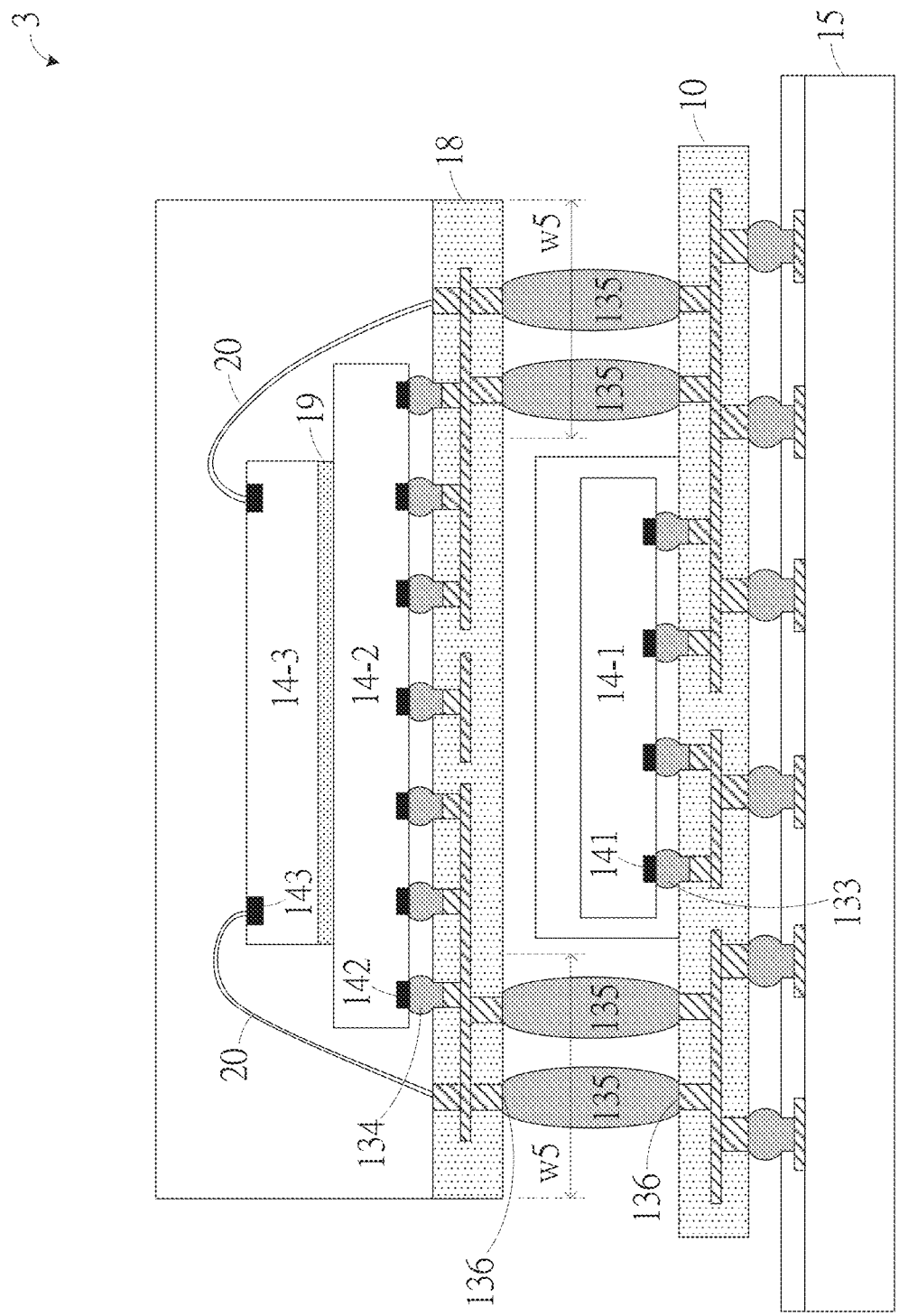
Figure 3C:
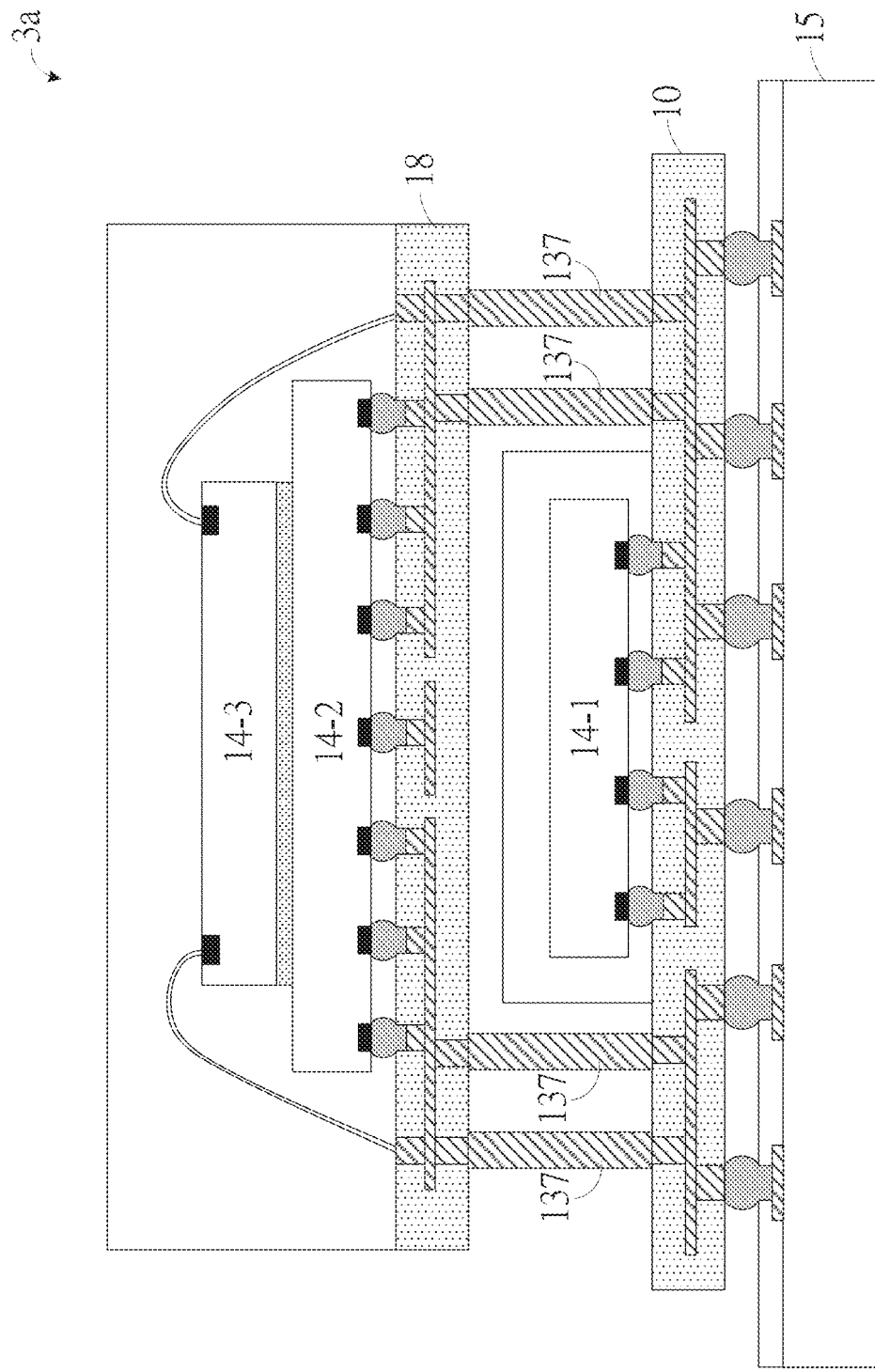
FIG. 3C is a schematic cross-sectional view of a package structure of a PoP stacked package device in another aspect of the prior art.
Figure 4A:
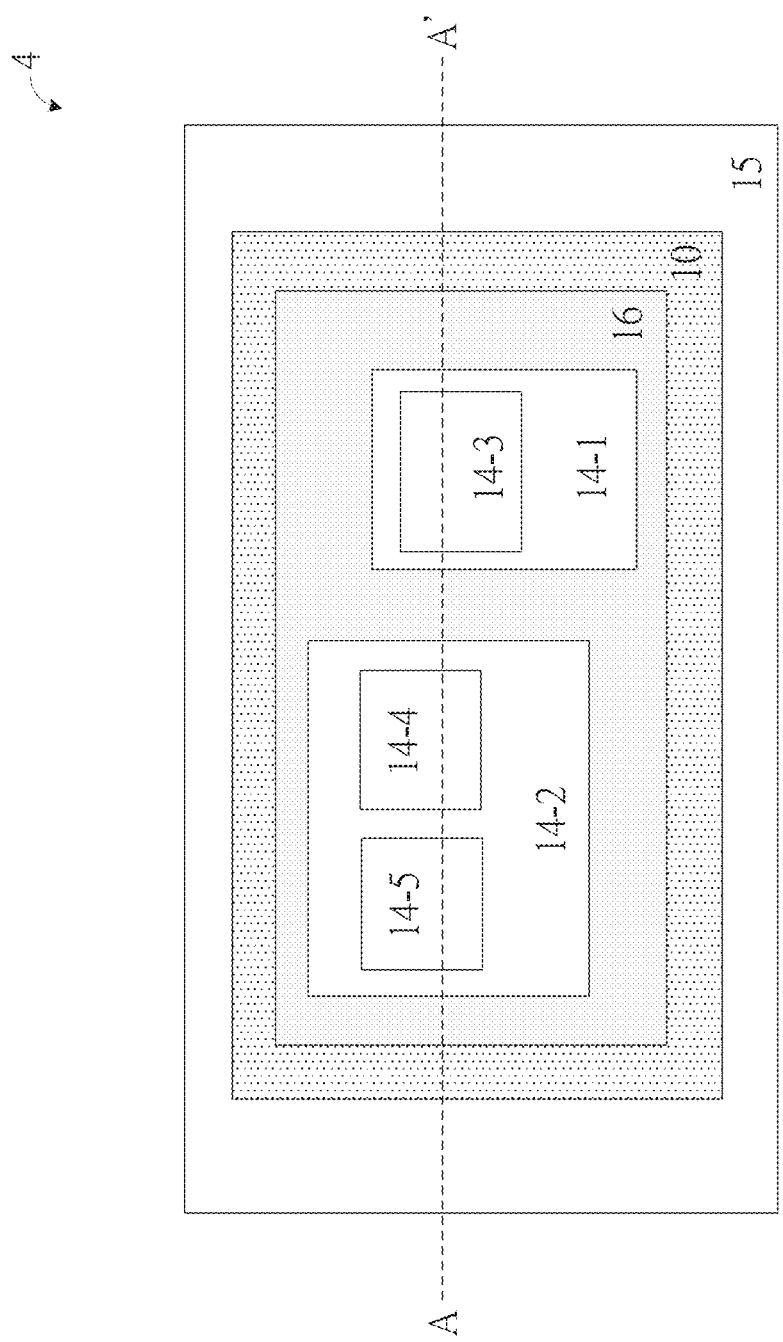
FIGS. 4A and 4B are respectively a schematic plan view and a schematic cross-sectional view of a package structure of a 3D package device of the prior art.
Figure 4B:
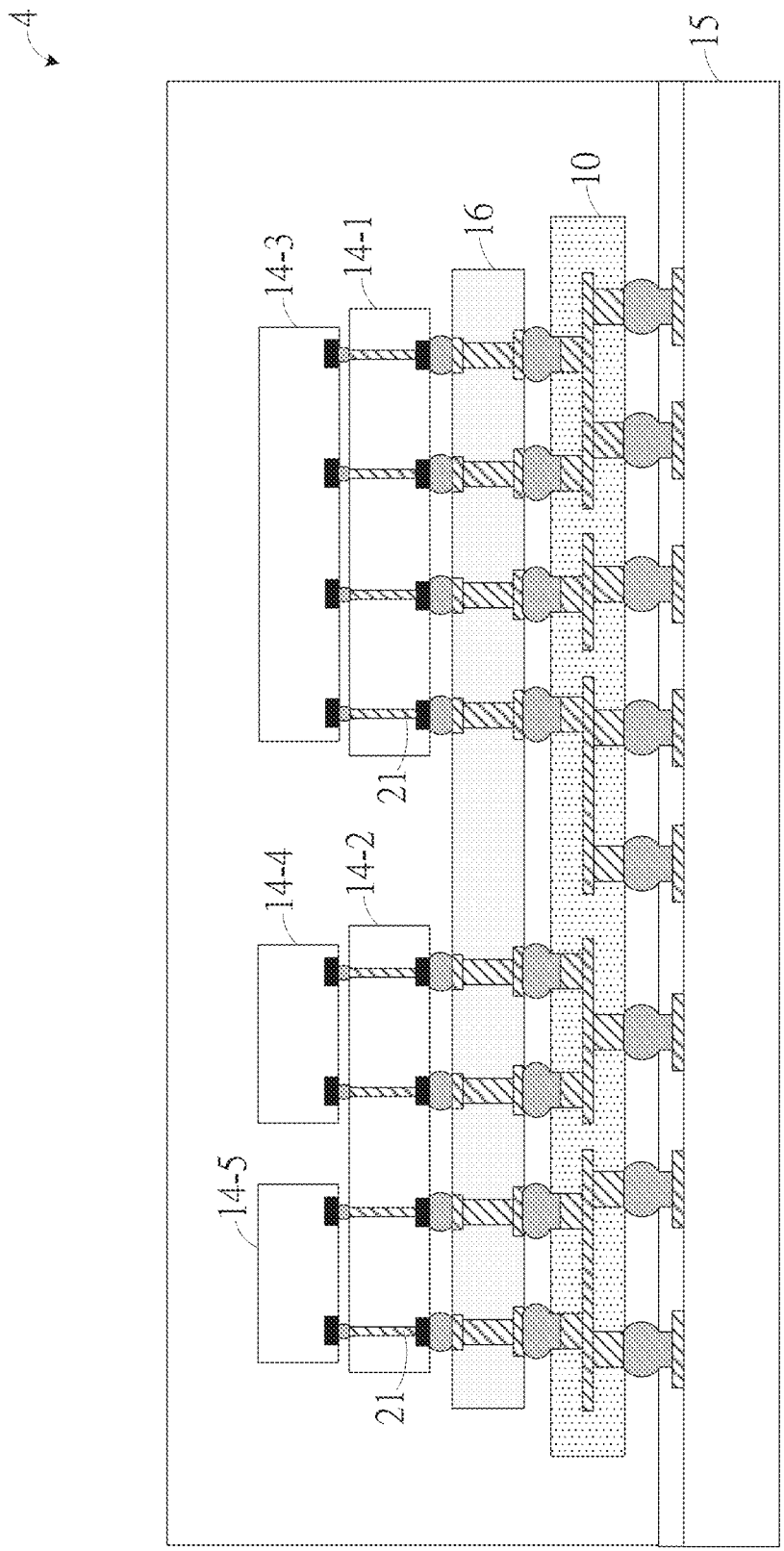

Continuing, the second carrying part 34 of the flexible carrier 30, the second chip 37-2, the third chip 37-3 and the molding layer 43 constitute an upper package part 52 of the semiconductor package device 5. The upper package part 52 is electrically connected to the bottom package part 51 through the first flexible part 35. Therefore, the signal transmission between the upper package part 52 and the bottom package part 51 can be completed through the conductive layers W2 and W3 inside the first flexible part 35, which is equivalent to the patterned build-up circuit 311. In other words, in the embodiment, the first flexible part 35 of the flexible carrier 30 is used to replace the solder bump or the conductive pillar of the prior art (for example, to replace the solder bump 135 shown in FIG. 3B, or the conductive pillar 137 shown in FIG. 3C) as the electrical connection path and signal transmission path between the upper package part 52 and the bottom package part 51.

Since the space between the second carrying part 34 and the first carrying part 33 does not require the solder bump or the conductive pillar (the space can be fully provided for the disposing of the chip 37-1), the length w6 of the flexible carrier 30 in the horizontal direction can be reduced, thereby reducing the package volume of the semiconductor package device 5. In addition, in the embodiment, the upper package part 52 is firmly connected to the bottom package part 51 by the adhesive layer 40, so that the overall structural strength of the semiconductor package device 5 can be improved. The mentioned above are the technical effects of the first embodiment of the invention.

Figure 5D:
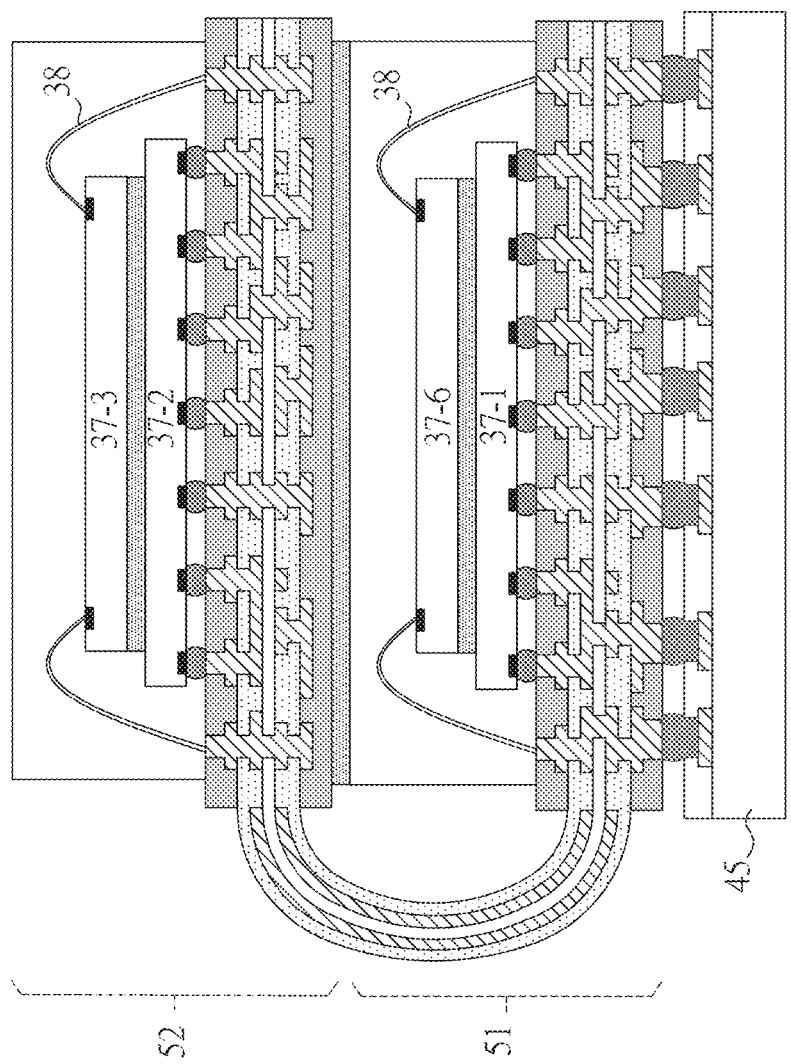
FIG. 5D is a schematic cross-sectional view showing that in the semiconductor package device according to the first embodiment of the invention, both the bottom package part and the upper package part are provided with two chips in back-to-back.

In addition, it is to be noted that in FIG. 5C, there is one chip 37-1 disposed in the bottom package part 51, and there are two chips 37-2 and 37-3 disposed in the upper package part 52. However, in other embodiments, the number of chips is variable. For example, in other embodiment, the bottom package part 51 is equipped with a sixth chip 37-6 on the first chip 37-1 in back-to-back manner, while the upper package part 52 only has a second chip 37-2. Or, as shown in FIG. 5D, both the bottom package part 51 and the upper package part 52 are provided with two chips in back-to-back manner.

Figure 6A:
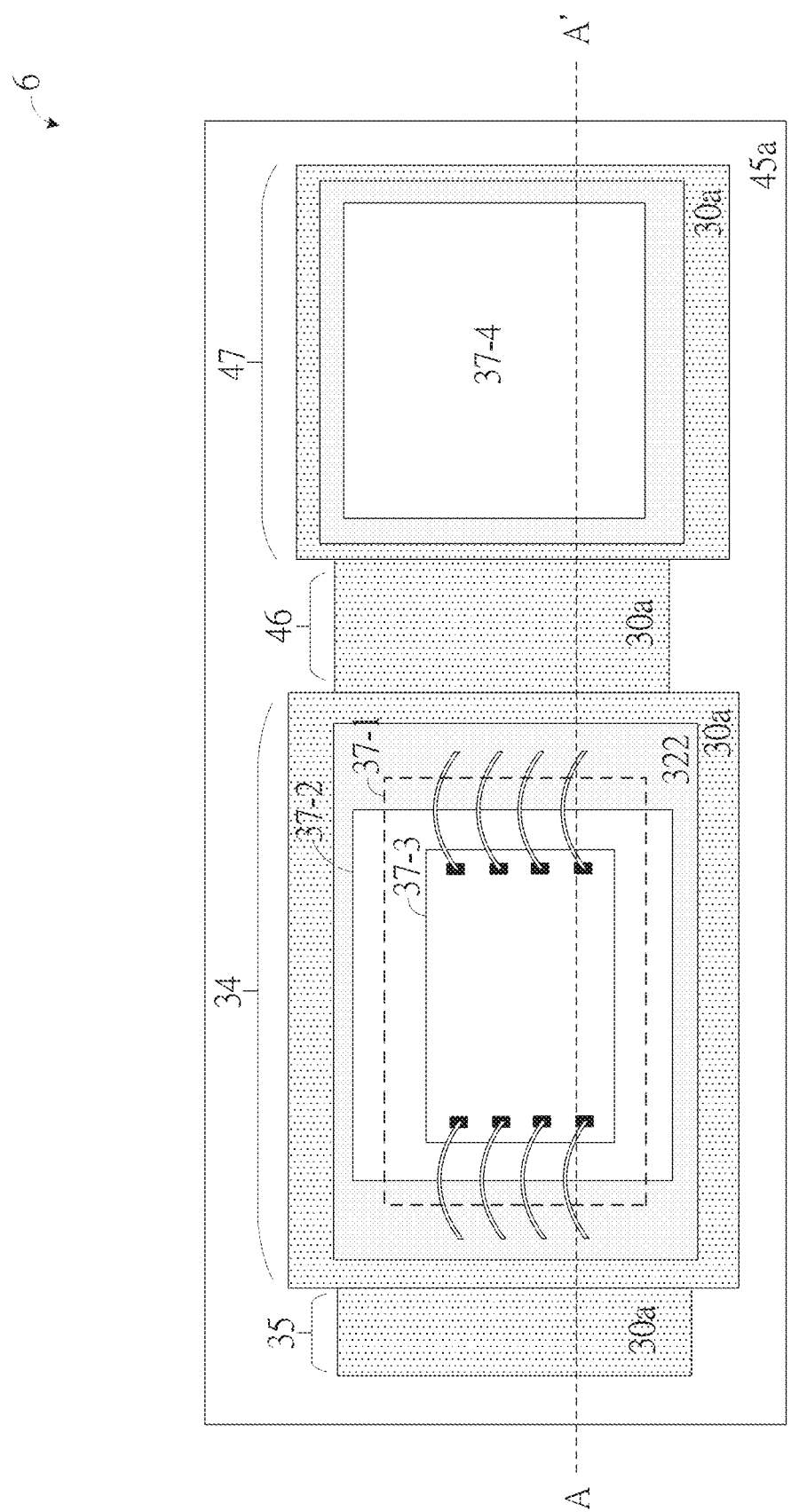
FIG. 6A is a schematic top view of a semiconductor package device according to the second embodiment of the invention.
Figure 6B:
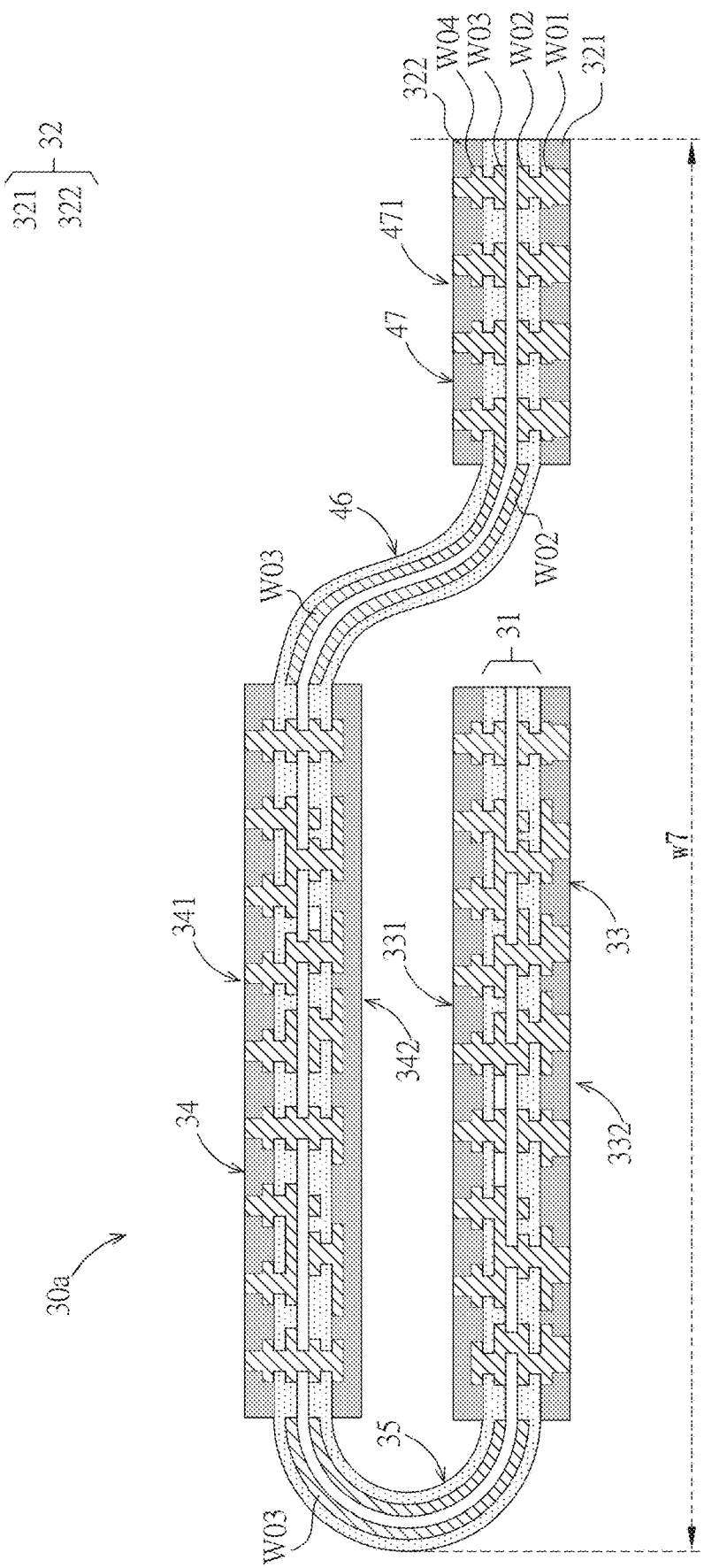
FIG. 6B is a schematic cross-sectional view of a flexible carrier of the semiconductor package device according to the second embodiment of the invention.
Figure 6C:
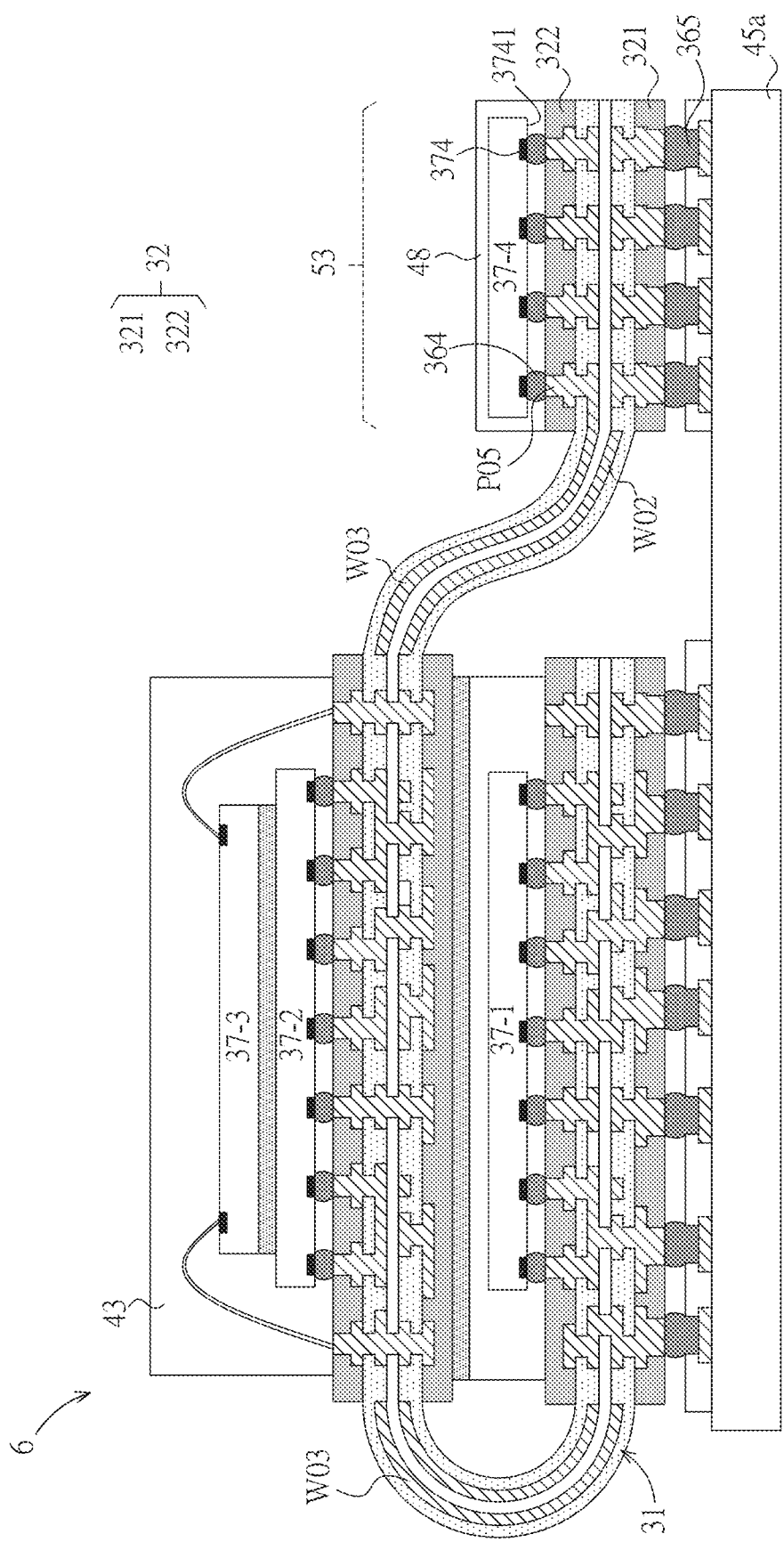
FIG. 6C is a schematic cross-sectional view of the semiconductor package device according to the second embodiment of the invention.

FIG. 6A to FIG. 6C are respectively a schematic top view and a schematic cross-sectional view of a package structure of a semiconductor package device 6 of the second embodiment. As shown in FIG. 6A, compared to the semiconductor package device 5 of the first embodiment, except for the first carrying part 33, the first flexible part 35, and the second carrying part 34, in the embodiment, a flexible carrier 30a of the semiconductor package device 6 further includes a second flexible part 46 and a third carrying part 47. Additionally, in addition to the first chip 37-1, the second chip 37-2, and the third chip 37-3, the semiconductor package device 6 of the second embodiment further includes a fourth chip 37-4, which is disposed on the third carrying part 47.

As shown in FIG. 6B, the flexible carrier 30a is further extended to form the second flexible part 46 and the third carrying part 47. Compared with the flexible carrier 30 of the first embodiment, the flexible carrier 30a of this embodiment has a larger length w7 in the horizontal direction. Among them, the second flexible part 46 only has the flexible layer 31, and the third carrying part 47 has the flexible layer 31 and the rigid layer 32. The third carrying part 47 is connected to the second carrying part 34 via the second flexible part 46, and the second flexible part 46 can be flexed arbitrarily, so that the third carrying part 47 and the first carrying part 33 can be arranged on a circuit board having the same or different planes. The circuit board of this embodiment is the circuit board 45a having the same plane as shown in FIG. 6C.

As shown in FIG. 6C, which is a cross-sectional view along the line AA' in FIG. 6A, in the semiconductor package device 6 of this embodiment, the first chip 37-1, the second chip 37-2, and the fourth chip 37-4 is also arranged on the first side 471 of the third carrying part 47 by flip-chip manner. In detail, the active surface 3741 of the fourth chip 37-4 faces downwards, and is electrically connected to the conductive pillar P05 inside the third carrying part 47 by the conductive pad 374 and the solder bump 364, and then electrically connected to the conductive layers W01-W04 inside the third carrying part 47. In other words, the active surface 3741 of the fourth chip 37-4 is electrically connected to the first side 471 of the third carrying part 47 by flip-chip manner.

In addition, the semiconductor package device 6 further includes a molding layer 48. It is similar to the molding layer 42 and the molding layer 43 that the molding layer 48 is also disposed or formed on the second rigid layer 322 of the first side 471 of the third carrying part 47 by the molding process, and the molding layer 48 is also completely covered the fourth chip 37-4 and the solder bump 364.

Continuing, the third carrying part 47, the fourth chip 37-4, and the molding layer 48 of the flexible carrier 30a constitute a side package part 53 of the semiconductor package device 6. The side package part 53 is connected to the upper package part 52 via the second flexible part 46 of the flexible carrier 30a. Therefore, the signal transmission between the side package part 53 and the upper package part 52 can be transmitted through the conductive layers W02 and W03 inside the second flexible part 46.

In this embodiment, the flexibility of the flexible carrier 30a (that is, the second flexible part 46 presents arbitrary bending) overcomes the height difference between the vertical positions of different components to complete the electrical connection between the side package part 53 and the upper package part 52. Furthermore, the connection between the side package part 53 and the upper package part 52 does not need to pass through any interposer (especially a rigid silicon interposer), nor does it require any conductive pillar (such as copper pillar) or the solder bump.

In addition, since the second flexible part 46 of the flexible carrier 30a can be flexed downwards, the side package part 53 and the bottom package part 51 can be arranged in an appropriate position on the same plane. In addition, the side package part 53 is electrically connected to the circuit board 45a through the solder bump 365, so that the space above the side package part 53 can accommodate other components, which greatly improves the space utilization and the flexibility of package design. In other words, the flexible carrier 30a of this embodiment has greater flexibility and space utilization in both the horizontal and vertical directions, so that the package size of the semiconductor package device 6 in both the horizontal and vertical directions can be reduced. The mentioned above are the technical effects of the second embodiment of the invention.

Figure 6D:
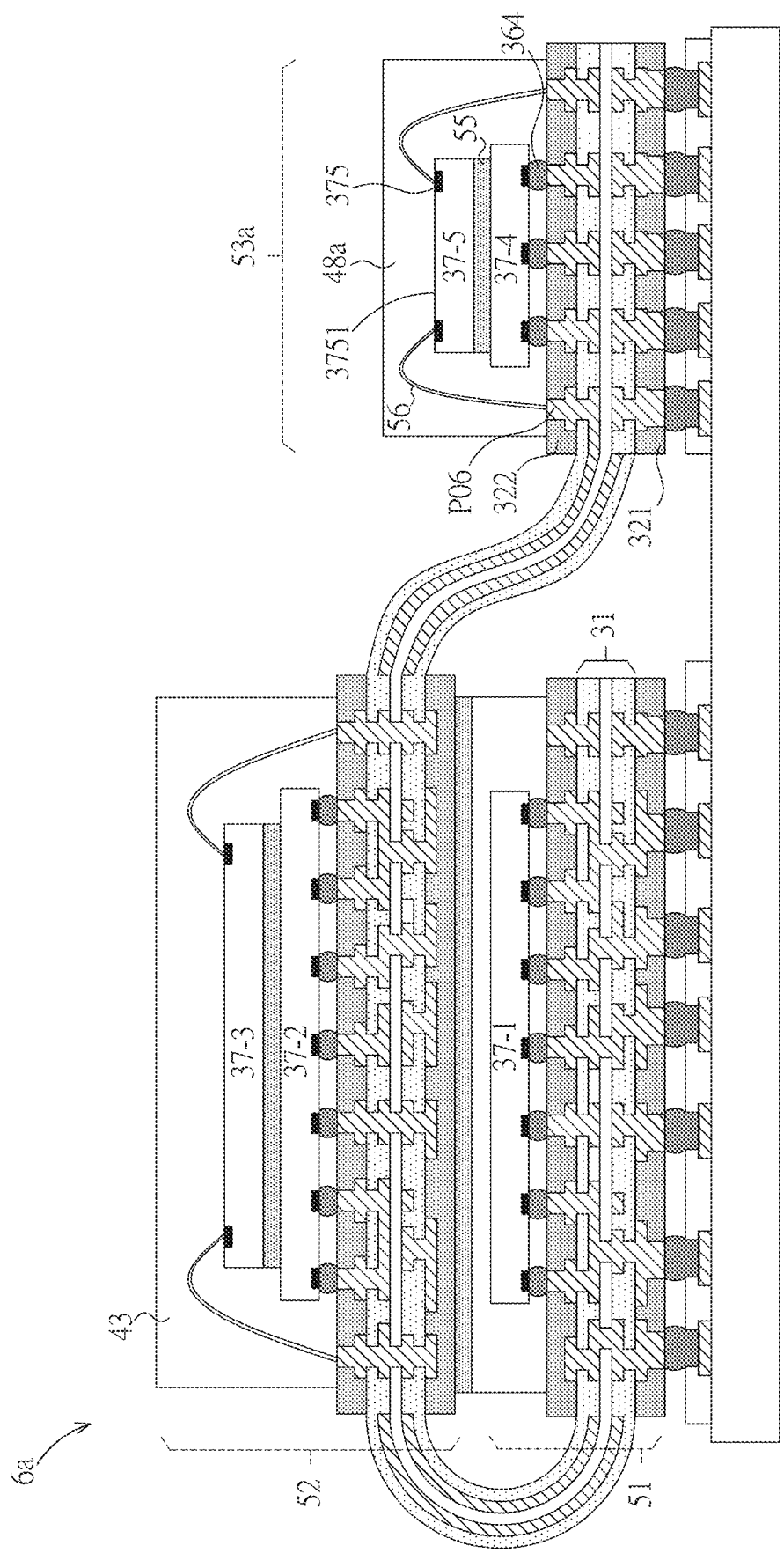
FIG. 6D is a schematic cross-sectional view of the semiconductor package device in another aspect according to the second embodiment of the invention.

As mentioned above, since there is still an idle space above the side package part 53, a fifth chip 37-5 can be further stacked on the fourth chip 37-4 to form a semiconductor package device 6a as shown in FIG. 6D.

FIG. 6D is a schematic cross-sectional view of the package structure of a semiconductor package device 6a of another aspect of the second embodiment. As shown in FIG. 6D, the fifth chip 37-5 is arranged on the fourth chip 37-4 in back-to-back manner through an adhesive layer 55. An active surface 3751 of the fifth chip 37-5 faces upward, and two conductive pads 375 provided on the active surface 3751 are electrically connected to the conductive pillars P06 inside the third carrying part 47, respectively, through two leads 56, and then the conductive pads 375 are electrically connected to the conductive layers W01-W04 inside the third carrying part 47. In other words, the active surface 3751 of the fifth chip 37-5 is electrically connected to the first side 471 of the third carrying part 47 by wire bonding manner.

In addition, the molding layer 48a completely covers the fourth chip 37-4, the fifth chip 37-5, the lead 56, and the solder bump 364. The third carrying part 47, the fourth chip 37-4, the fifth chip 37-5, the lead 56, and the molding layer 48a of the flexible carrier 30a constitute a side package part 53a of the semiconductor package device 6a.

In summary, a semiconductor package device of the invention utilizes a flexible part that can be bent at least 180-degree to connect the chip, module or heat sink with different heights without going through the circuit board or the interposer for circuit connection, which greatly increases the flexibility of package design, reduces the size of the circuit board, and reduces the increased cost of using the silicon interposer.

The above embodiments merely give the detailed technical contents of the present invention and inventive features thereof, and are not to limit the covered range of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor package device, comprising:
   a flexible carrier, which includes a flexible layer that has a patterned build-up circuit and is flexible, and a rigid layer combined with a part of a surface of the flexible layer, wherein the part where the flexible layer is combined with the rigid layer is formed as a first carrying part and a second carrying part, and the flexible layer without the rigid layer between the first carrying part and the second carrying part is formed as a first flexible part;
   a first chip, which has an active surface and a non-active surface opposite to each other, and is combined to the first carrying part by flip-chip manner with a side of active surface;
   a first molding layer, which is disposed on the first carrying part, and covers the first carrying part and the first chip;
   a first adhesive layer, which is disposed on the first molding layer for the second carrying part to be combined with the first molding layer, and the first flexible part connecting the second carrying part and the first carrying part is bent at least 180-degree;
   a second chip, which has an active surface and a non-active surface opposite to each other, and is combined to the second carrying part by flip-chip manner with the side of active surface; and
   a second molding layer, which is disposed on the second carrying part and covers the second carrying part and the second chip;
   wherein the first carrying part and the second carrying part are electrically connected to each other by the patterned build-up circuit in the flexible carrier.

2. The semiconductor package device of claim 1, wherein a bottom of the first carrying part is electrically connected to a circuit board.

3. The semiconductor package device of claim 1, further comprising:
   a sixth chip, which is embedded in the first molding layer, has an active surface and a non-active surface opposite to each other, and is combined to the non-active surface of the first chip by a side of non-active surface through a fourth adhesive layer, wherein the active surface of the sixth chip is electrically connected to the first carrying part by a first lead.

4. The semiconductor package device of claim 1, further comprising:
   a third chip, which is embedded in the second molding layer, has an active surface and a non-active surface opposite to each other, and is combined to the non-active surface of the second chip by a side of non-active surface through a second adhesive layer, wherein the active surface of the third chip is electrically connected to the second carrying part by a second lead.

5. The semiconductor package device of claim 1, further comprising:
   a sixth chip, which is embedded in the first molding layer, has an active surface and a non-active surface opposite to each other, and is combined to the non-active surface of the first chip by a side of non-active surface through a fourth adhesive layer, wherein the active surface of the sixth chip is electrically connected to the first carrying part by a first lead; and a third chip, which is embedded in the second molding layer, has an active surface and a non-active surface opposite to each other, and is combined to the non-active surface of the second chip by the side of non-active surface through a second adhesive layer, wherein the active surface of the third chip is electrically connected to the second carrying part by a second lead.

6. The semiconductor package device of claim 1, wherein the flexible carrier further includes a second flexible part, which only has the flexible layer, and a third carrying part, which has the flexible layer and the rigid layer, the third carrying part is connected to the second carrying part through the second flexible part, and the third carrying part and the first carrying part are disposed on a same plane, and the semiconductor package device further comprising:

a fourth chip, which has an active surface and a non-active surface opposite to each other, and is combined to the third carrying part with the side of active surface by flip-chip manner; and a third molding layer, which is disposed on the third carrying part and covers the third carrying part and the fourth chip;

wherein, the first carrying part, the second carrying part, and the third carrying part are electrically connected by the patterned build-up circuit in the flexible carrier.

7. The semiconductor package device of claim 6, wherein a bottom of the third carrying part is electrically connected to a circuit board.

8. The semiconductor package device of claim 6, further comprising:

a fifth chip, which is embedded in the third molding layer and has an active surface and a non-active surface opposite to each other, is combined to the non-active surface of the fourth chip through a third adhesive layer with the non-active surface, where the active surface of the fifth chip is electrically connected to the third carrying part by a third lead.

9. The semiconductor package device of claim 6, further comprising:

a fifth chip, which is embedded in the third molding layer and has an active surface and a non-active surface opposite to each other, is combined to the non-active surface of the fourth chip through a third adhesive layer with the non-active surface, where the active surface of the fifth chip is electrically connected to the third carrying part by a third lead; and a third chip, which is embedded in the second molding layer, has an active surface and a non-active surface opposite to each other, and is combined to the non-active surface of the second chip by the side of non-active surface through a second adhesive layer, wherein the active surface of the third chip is electrically connected to the second carrying part by a second lead.

10. The semiconductor package device of claim 6, further comprising:

a fifth chip, which is embedded in the third molding layer and has an active surface and a non-active surface opposite to each other, is combined to the non-active surface of the fourth chip through a third adhesive layer with the non-active surface, where the active surface of the fifth chip is electrically connected to the third carrying part by a third lead;

a sixth chip, which is embedded in the first molding layer, has an active surface and a non-active surface opposite to each other, and is combined to the non-active surface of the first chip by the side of non-active surface through a fourth adhesive layer, wherein the active surface of the sixth chip is electrically connected to the first carrying part by a first lead; and a third chip, which is embedded in the second molding layer, has an active surface and a non-active surface opposite to each other, and is combined to the non-active surface of the second chip by the side of non-active surface through a second adhesive layer, wherein the active surface of the third chip is electrically connected to the second carrying part by a second lead.

\* \* \* \* \*